United States Patent [19]

Nishio

[11] Patent Number: 4,905,279
[45] Date of Patent: Feb. 27, 1990

[54] LEARNING-FUNCTIONALIZED REMOTE CONTROL RECEIVER

[75] Inventor: Masaaki Nishio, Osaka, Japan

[73] Assignee: NEC Home Electronics Ltd., Osaka, Japan

[21] Appl. No.: 278,455

[22] Filed: Dec. 1, 1988

[30] Foreign Application Priority Data

Feb. 26, 1988 [JP] Japan .................................. 63-43756

[51] Int. Cl.$^4$ ............................................. H03J 9/00
[52] U.S. Cl. .......................................... 380/9; 380/21;
358/194.1; 340/825.69; 340/825.72;
340/825.76; 455/151; 455/352; 455/353;
455/355; 455/603
[58] Field of Search ...................... 358/194.1; 340/539,
340/825.24, 825.44, 825.47, 825.48, 825.69,
825.72–825.76; 455/49, 66, 68, 70, 71, 74, 88,
89, 90, 92, 151, 344, 352, 353, 355, 603;
364/200, 900

[56] References Cited

U.S. PATENT DOCUMENTS

| | | | |
|---|---|---|---|
| 4,322,855 | 3/1982 | Mogi et al. | 455/151 |
| 4,394,691 | 7/1983 | Amano et al. | 358/194.1 |
| 4,482,947 | 11/1984 | Zato et al. | 358/194.1 X |
| 4,509,211 | 4/1985 | Robbins | 455/603 |
| 4,566,034 | 1/1986 | Harger et al. | 358/194.1 |
| 4,623,887 | 11/1986 | Welles, II | 358/194.1 X |
| 4,626,848 | 12/1986 | Ehlers | 340/825.69 |
| 4,703,359 | 10/1987 | Rumbolt et al. | 358/194.1 |
| 4,769,643 | 9/1988 | Sogame | 340/825.69 |
| 4,771,283 | 9/1988 | Imoto | 340/825.72 X |
| 4,772,876 | 9/1988 | Laud | 340/539 |
| 4,774,511 | 9/1988 | Rumbolt et al. | 340/825.69 |
| 4,802,114 | 1/1989 | Sogame | 364/900 |
| 4,807,052 | 2/1989 | Amano | 358/194.1 |
| 4,825,200 | 4/1989 | Evans et al. | 340/825.72 X |
| 4,837,627 | 6/1989 | Mengel | 358/194.1 X |

Primary Examiner—Stephen C. Buczinski
Assistant Examiner—Bernarr E. Gregory
Attorney, Agent, or Firm—Cushman, Darby & Cushman

[57] ABSTRACT

A remote control receiver which can be "taught" to recognize a remote control signal from any of a plurality of remote control receivers as its control signal. For this purpose, the transmitting code and the carrier of a remote control signal are analyzed and the transmitting code is stored in connection with the instruction content during a learning mode. Then, during normal operation, a received remote control signal is filtered by a band pass filter in which the filter band is set in accordance with the carrier of the remote control signal stored during the learning mode. The filtered signal is then decrypted with reference to the stored transmitting code, thereby permitting receipt of the remote control signal transmitted from a heterogeneous remote control transmitter. In this manner, the remote control receiver may be "taught" to respond to commands from a remote control transmitter the user is accustomed to using.

3 Claims, 2 Drawing Sheets

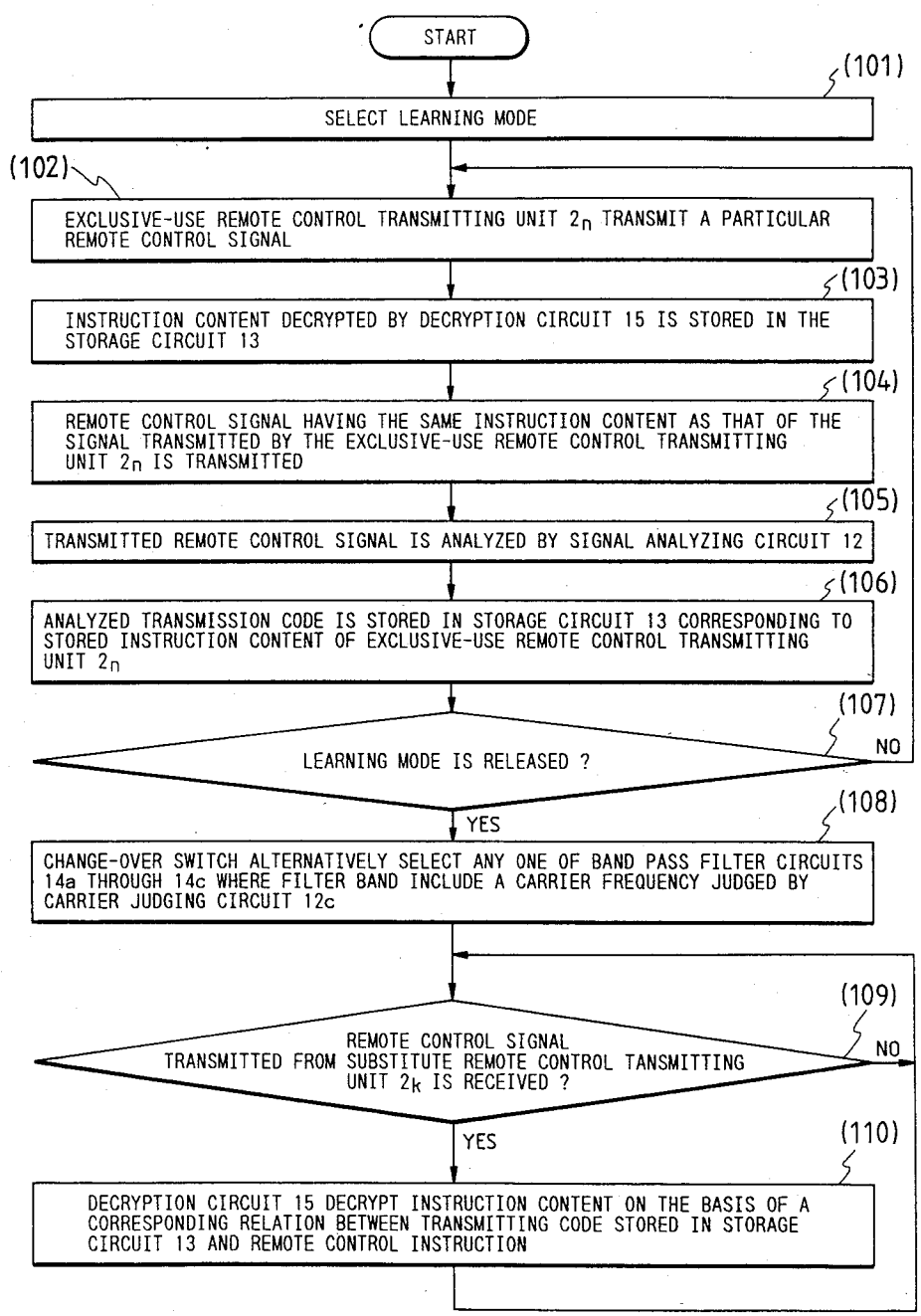

LEARNING-FUNCTIONALIZED REMOTE CONTROL RECEIVER

BACKGROUND OF THE INVENTION

1. Field of the Invention

The present invention relates to a remote control receiver having a learning function for responding to a wide variety of remote control transmitters.

2. Description of the Prior Art

The great majority of home electric appliances today are constructed so as to be remotely controlled by remote control transmitters. There is, however, a problem in such systems in that the signal codes of products offered by the same maker are not unified depending on the type of appliance. To overcome such a problem, a learning-functionalized remote control transmitter has been proposed in which all kinds of operational objects can be remotely controlled by use of a common remote control transmitter irrespective of the maker or the type of remote control object.

A conventional learning-functionalized remote control transmitter 1 is depicted in FIG. 1. This transmitter is capable of learning remote control signals of a plurality of remote control transmitting units $2_1$ through $2_n$, each having a different transmitting code, by relating a carrier and transmitting code to the instruction content for every signal. Once the learning is finished, the remote control signals corresponding to the necessary instructions are transmitted to objective appliances $3_1$ through $3_n$ in place of the exclusive-use remote control transmitting units $2_1$ to $2_n$. In other words, all remote control transmitting signals are transmitted by the transmitter 1 to control the objective appliances $3_1$ to $3_n$.

The learning-functionalized remote control transmitter 1 of FIG. 1 has such an advantage that the transmitter is capable of integrating the plurality of remote control transmitting units $2_1$ to $2_n$ having different signal codes and unitizing these functions into one. There arises, however, a problem in which an operational mistake peculiar to the transition often takes place when a particular remote control transmitting unit which the user is accustomed to is changed over to the remote control transmitter 1 having a learning function. Namely, because all the electric appliances for domestic use are remotely controlled by the single remote control transmitter 1 of FIG. 1, it is absolutely necessary to prepare a large number of keys for inputting the instructions. Also, where some keys are provided with additional functions to miniaturize the keyboard, extra key operations such as selection of the functions by use of a function change-over key are needed in addition to ordinary key operations. Hence, much time is required until the user becomes well accustomed to such key-operations.

SUMMARY OF THE INVENTION

A learning-functionalized remote control receiver according to the present invention for obviating the above-described problems comprises:

signal analyzing means for receiving a remote control signal and analyzing its carrier and transmitting code in a learning mode;

storage means for storing the transmitting code of the remote control signal analyzed by the signal analyzing means in connection with the content of an instruction of the remote control signal during the learning mode;

band pass filter means having a filter band set in accordance with the carrier of the remote control signal analyzed by the signal analyzing means in the learning mode; and decryption means for decrypting a remote control signal transmitted in an operation mode in accordance with the transmitting code stored in the storage means during the learning mode.

In the invention so arranged, the transmitting code and the carrier of the remote control signal are analyzed, and the transmitting code is stored in connection with the instruction content during a learning mode. The remote control signal filtered by the band pass filter means having the filter band set in accordance with the carrier of the remote control signal is then decrypted during normal operation with reference to the transmitting code stored in the storage means, thereby permitting receipt of the remote control signal transmitted from a heterogeneous remote control transmitter. The user is thus able to "program" the remote control receiver of the invention to operate at the carrier frequency of a preferred remote control transmitter.

BRIEF DESCRIPTION OF THE DRAWINGS

FIG. 3 is an explanatory flowchart showing the learning function of the receiver of FIG. 2.

DETAILED DESCRIPTION OF THE PREFERRED EMBODIMENT

Figure 1:
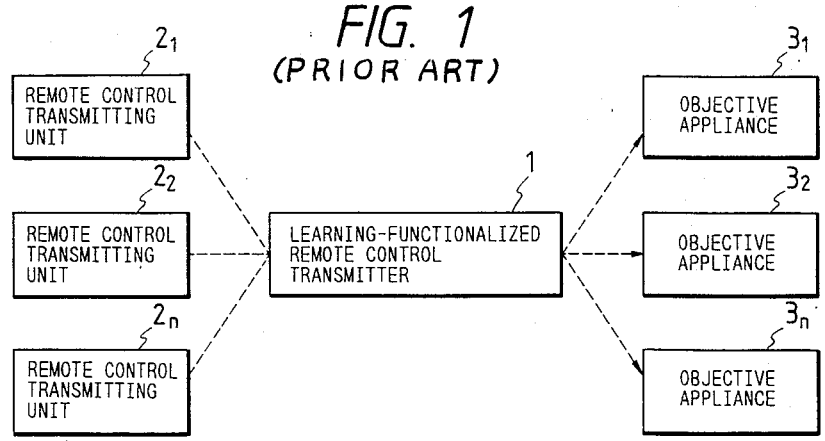
FIG. 1 is a circuit block diagram illustrating one example of a prior art learning-functionalized remote control transmitter.
Figure 2:
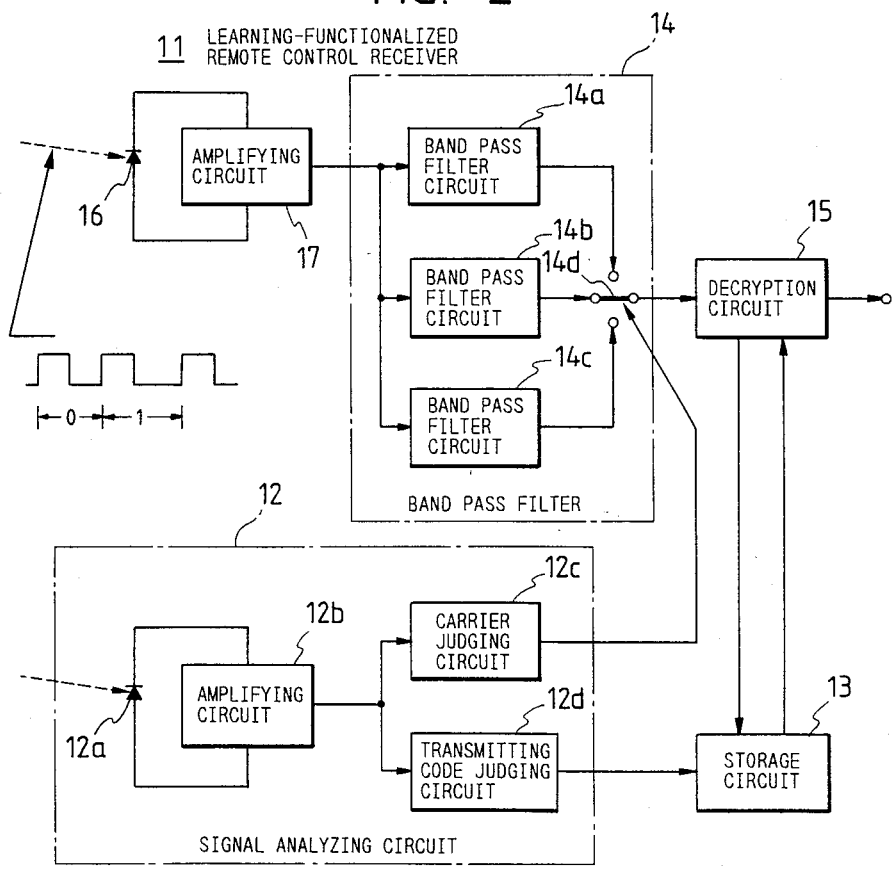
FIG. 2 is a circuit block diagram illustrating an embodiment of a learning-functionalized remote control receiver according to the present invention.

An embodiment of the present invention will hereinafter be described with reference to FIGS. 2 and 3. FIGS. 2 and 3 are a circuit block diagram illustrating one embodiment of a learning-functionalized remote control receiver according to the present invention and an explanatory flowchart showing the learning function thereof.

In FIG. 2, a learning-functionalized remote control receiver 11 is shown which has been developed on the assumption that this receiver 11 may be incorporated into all kinds of home electric appliances defined as objects to be remotely controlled. The remote control receiver 11 has a learning function for any type of transmitting code regardless of the type of remote control transmitting units $2_1$ to $2_n$ provided on the transmission side. The essential parts of this learning-functionalized remote control receiver 11 are a signal analyzing circuit 12 required to effect the learning process, a storage circuit 13, a band pass filter 14 needed after effecting the learning process and a decryption circuit 15.

The signal analyzing circuit 12 consists of a light receiving element 12a for receiving the remote control signal, carrier judging circuit 12c connected to an amplifying circuit 12b which amplifies the received output, and a transmitting code judging circuit 12d. In this embodiment, the remote control signal uses infrared-rays of light in which carriers of 34 kHz to 40 KHz are amplitude-modulated by pulsewidth-modulated (PWM) signals that are pulsewidth-modulated in conformity with the transmitting code. In general, the carrier frequency and the transmitting code differ depending upon the remote control transmitting units $2_1$ to $2_n$. The storage circuit 13 serves to store the transmitting code of the remote control signal analyzed by the signal analyzing circuit 12 in accordance with its instruction content.

The band pass filter 14, on the other hand, is connected to a light receiving element 16 for receiving the remote control signal via an amplifying circuit 17 which amplifies the receiver output. In this embodiment, band pass filter circuits 14a, 14b and 14c are provided having filter bands adaptive to three kinds of carrier frequencies of 34 kHz, 36 kHz and 38 kHz and are alternatively selected by a change-over switch 14d changed over by a judging output of the carrier judging circuit 12c. The decryption circuit 15 decrypts the remote control instruction defined by the remote control signal by comparing the remote control signal filtered by the band pass filter 14 to the transmitting code stored in the storage circuit 13.

The operation of the circuit of FIG. 2 will now be described in conjunction with the flow chart of FIG. 3. The description will be focused on the operation of causing the learning-functionalized remote control receiver 11 to learn the transmitting code of a remote control transmitting unit 2k having an unjudged transmitting code.

As shown in step (101), the learning-functionalized remote control receiver 11 is at first changed over to a learning mode. At step (102), the exclusive-use remote control transmitting unit 2n then transmits a particular remote control signal to an objective appliance incorporating the remote control receiver 11. The remote control signal at that time is received by the light receiving element 16. Subsequently, the remote control signal passes through the band pass filter 14 having the filter band adjusted to the exclusive-use remote control transmitting unit 2n and is then transmitted to the decryption circuit 15. The instruction content decrypted by the decryption circuit 15 is then stored in the storage circuit 13 in step (103). Next, the remote control transmitting unit 2k that is to be used for general purposes as a substitute for the exclusive-use remote control transmitting unit 2n is directed to the learning-functionalized remote control transmitter 11, and, as shown in step (104), a remote control signal having the same instruction content as that of the signal transmitted by the exclusive-use remote control transmitting unit 2n is transmitted.

The thus transmitted remote control signal is received by the light receiving element 12a and undergoes analyses by the carrier judging circuit 12c and by the transmitting code judging circuit 12d provided in the signal analyzing circuit 12 in step (105). The carrier frequency and the transmitting code are thus judged, and the transmitting code is stored in the storage circuit 13 in step (106), at a position corresponding to the stored instruction content when operating the exclusive-use remote control transmitting unit 2n as described above.

Subsequent to this step, there is repeated an operation of causing the remote control receiver 11 to learn some necessary functions selected among the functions of the exclusive-use remote control transmitting unit 2n by relating to the operation of the substitute remote control transmitting unit 2k each time one of the functions is transmitted. Just when completing the learning process, the learning mode is released. In step (107) it is then judged whether the learning mode has been released, and in step (108), where the judgment result of the judging step (107) is received, the change-over switch 14d is controlled to alternatively select any one of the band pass filter circuits 14a through 14c where the filter band includes a carrier frequency judged by the carrier judging circuit 12c. Consequently, only the substitute remote control transmitting unit 2k which substitutes for the exclusive-use remote control transmitting unit 2n effectively functions with respect to the remote control receiver 11.

Similarly, the above-mentioned learning operation is effected on the learning-functionalized remote control receivers incorporated into the appliances, whereby it is possible to change the substitute remote control transmitting unit 2k to which the user is well accustomed into a remote control transmitting unit used for general purpose. More specifically, the remote control signal transmitted from the substitute remote control transmitting unit 2k which has been adapted for general purpose use is, as shown in step (109), fed via the light receiving element 16 and the amplifying circuit 17 to the band pass filter 14. After passing through the predetermined band pass filter circuits 14a to 14c which have previously been alternatively selected, the remote control signal is supplied to the decryption circuit 15. Then, as shown in step (110), the decryption circuit 15 decrypts the instruction content on the basis of a corresponding relation between the transmitting code stored in the storage circuit 13 and the remote control instruction. A command based on the decrypted result can be issued as if receiving it from the exclusive-use remote control transmitting unit 2n.

As explained earlier, the learning-functionalized remote control receiver 11 is arranged such that the signal analyzing circuit 12 analyzes the transmitting code and the carrier of the remote control signal in the learning mode; the storage circuit 13 stores a pair of the instruction content and the transmitting code; and the remote control signal which is filtered by the band pass filter 14 in which the filter band is set in accordance with the carrier of the remote control signal is decrypted by the decryption circuit 15 with reference to the transmitting code stored in the storage circuit 13. Because of this arrangement, even in the case of a heterogeneous remote control transmitting unit 2k for transmitting a remote control signal the transmitting code and the carrier of which are different from those in the exclusive-use remote control transmitter unit 2n, the substitution of an arbitrary remote control transmitting unit 2n is practicable by imparting the results of analysis given by the signal analyzing circuit 12 to the band pass filter 14 and to the storage circuit 13. By virtue of utilization of the learning function on the receiving side of the remote control signal, it is thus possible to remotely control heterogeneous appliances having different signal code systems by making use of the remote control transmitting unit 2k to which the user is most accustomed, even when preparing no particular remote control transmitting unit for a general purpose.

Although a single exemplary embodiment of the invention is described in detail above, those skilled in the art will readily appreciate that many modifications are possible in the exemplary embodiment without materially departing form the novel teachings and advantages of the invention. All such modifications are intended to be included within the scope of the invention a defined in the following claims.

I claim:

1. A learning-functionalized remote control receiver, comprising:
signal analyzing means for receiving a remote control signal and determining its carrier and transmitting code in a learning mode of said remote control receiver;

storage means for storing during the learning mode the transmitting code of said remote control signal determined by said signal analyzing means in connection with the content of an instruction of said analyzed remote control signal;

band pass filter means having a filter band set in accordance with the determined carrier of said analyzed remote control signal in said learning mode; and decryption means for decrypting a remote control signal transmitted in an operation mode of said remote control receiver in accordance with the transmitting code stored in said storage means during said learning mode.

2. A method of teaching a learning-functionalized remote control receiver the transmitting code of a remote control transmitting unit, comprising the steps of:

selecting a learning mode of the learning-functionalized remote control receiver; transmitting a first remote control signal from said remote control transmitting unit to said learning-functionalized remote control receiver;

decrypting an instruction content of said first remote control signal;

storing said instruction content in storage means of said learning-functionalized remote control receiver;

transmitting a second remote control signal from a further remote control transmitting unit having the same instruction content as said first remote control signal;

analyzing said second remote control signal for its transmission code;

storing the transmission code of said second remote control signal in said storage means at a location corresponding to said stored instruction content of said first remote control signal; and releasing said learning mode, wherein the instruction contents of remote control signals subsequently received by said learning-functionalized remote control receiver are decrypted on the basis of a relationship between the transmission code of said second remote control signal stored in said storage means.

3. The teaching method of claim 2, comprising the further step of selectively band pass filtering said second remote control signal from said further remote control transmitting unit in accordance with a carrier frequency of said first remote control signal from said remote control transmitting unit.

* * * * *